United States Patent [19]
Bowers

[11] Patent Number: 5,587,689
[45] Date of Patent: Dec. 24, 1996

[54] VOLTAGE CONTROLLED AMPLIFIER WITH A NEGATIVE RESISTANCE CIRCUIT FOR REDUCING NON-LINEARITY DISTORTION

[75] Inventor: Derek F. Bowers, Sunnyvale, Calif.

[73] Assignee: Analog Devices, Inc., Norwood, Mass.

[21] Appl. No.: 536,497

[22] Filed: Sep. 28, 1995

[51] Int. Cl.[6] .............................. H23G 3/32; H03F 3/45
[52] U.S. Cl. ......................... 330/254; 330/149; 330/252
[58] Field of Search ..................................... 330/149, 252, 330/254

[56] References Cited

U.S. PATENT DOCUMENTS

| | | | |
|---|---|---|---|
| 4,075,574 | 2/1978 | Gilbert | 330/257 |
| 4,146,844 | 3/1979 | Quinn | 330/149 |
| 4,692,712 | 9/1987 | Quinn | 330/252 |
| 4,769,617 | 9/1988 | Mizuide | 330/252 X |
| 4,904,952 | 2/1990 | Tanimoto | 330/252 |
| 5,138,276 | 8/1992 | Marie | 330/252 |

OTHER PUBLICATIONS

Sansen, Meyer, "Distortion in Bipolar Transistor Variable-Gain Amplifiers", *IEEE J. Solid–State Circuits*, vol. SC–8, pp. 275–282, Aug. 1973.

Primary Examiner—James B. Mullins
Attorney, Agent, or Firm—Koppel & Jacobs

[57] ABSTRACT

A wide-band voltage controlled amplifier includes a differential stage and a gain control stage. The differential stage responds to a differential input signal by apportioning a bias current between the two sides of the differential stage. The gain control stage responds to a variable gain control voltage by further dividing the current in each side of the differential stage to set the gain of the VCA. The negative resistance circuit is connected across the differential stage to supply a correction current that reduces the non-linearity distortion in the current supplied to the gain control stage, which in turn improves the linearity of the VCA's output voltage.

8 Claims, 3 Drawing Sheets

VOLTAGE CONTROLLED AMPLIFIER WITH A NEGATIVE RESISTANCE CIRCUIT FOR REDUCING NON-LINEARITY DISTORTION

BACKGROUND OF THE INVENTION

1. Field of the Invention

The present invention generally relates to the field of voltage controlled amplifiers (VCAs), and more specifically to a negative resistance circuit for reducing distortion in a VCA.

2. Description of the Related Art

Non-linearity distortion is a substantial cause of error in a wide-band amplifier. The mechanisms which contribute to non-linearity distortion are inherent in the physical properties of the semiconductor pn junctions in bipolar transistors. The signal-amplitude error in an uncompensated wide-band amplifier may be as high as one order of magnitude. Many prior art attempts have been made to reduce the non-linearity of this type of differential amplifier.

A conventional differential amplifier includes a differential stage having a pair of emitter-coupled transistors. A pair of emitter resistors are connected between the respective transistors' emitters and a current source, and a pair of gain resistors are connected between the respective transistors' collectors and a supply voltage. The differential amplifier responds to a differential input voltage applied at the bases of the emitter-coupled transistors by apportioning the source current between the two sides of the differential stage to produce a differential output voltage between their collectors.

Ideally, the differential output voltage is a linear function of the differential input voltage. However, the base-emitter voltages of the emitter-coupled transistors are logarithmic functions of the currents that flow through the respective sides of the differential amplifier, and hence are only equal when the differential input voltage is zero. Therefore, the difference between the base-emitter voltages is manifested as a non-linearity distortion in the differential output voltage.

U.S. Pat. No. 4,146,844 to Quinn, discloses a feed-forward technique to provide a first order correction of amplifier distortion. In FIG. 4 of Quinn, an additional cascode stage consisting of a pair of base connected transistors is connected to the primary differential stage so that the differential voltage at an output of the differential stage is equal to the difference in the base-emitter voltages of the differential stage transistors. A correction amplifier is coupled to the primary differential stage to sense base-emitter distortion through the differential voltage and develop an error signal which, in turn, is coupled to the output of the primary differential stage to cancel any distortion which may be present.

Quinn's primary differential stage includes a pair of emitter-coupled transistors which receive differential signals at their respective bases. The correction amplifier is a second differential stage of emitter-coupled transistors. The bases of the transistors in the second differential stage are coupled to the collectors of the transistors in the primary differential stage. The differential configuration of the correction amplifier reduces the distortion present in the primary differential stage. However, this configuration also introduces a phase distortion analogous to the distortion caused by a feed-back loop.

Sansen and Meyer, "Distortion in bipolar Transistor Variable-Gain Amplifiers," IEEE Journal Solid-State Circuits, vol. SC-8, pp. 275–282, August 1973 disclose a variable gain amplifier 10, commonly known as a VCA, as shown in FIG. 1. VCAs are commonly used in audio systems to provide variable signal compression. The VCA 10 includes a differential stage 12 that responds to a differential voltage $V_{in}$ to produce currents $I_1$ and $I_2$. The difference between $I_2$ and $I_1$ forming a differential signal current $i_{in}$. A gain control stage 14 apportions $I_1$ and $I_2$ between respective pairs of gain transistors in response to a variable control voltage $V_c$ to set the gain of the VCA and produce a differential output voltage $V_{out}$.

The differential stage 12 includes a pair of emitter-coupled transistors Q1 and Q2. A pair of emitter resistors, which are both shown as $R_E$, are connected between the respective emitters 16 and 18 of Q1 and Q2 and a current source 20, which is connected to a low reference voltage $V_{EE}$ and supplies bias current $I_E$. The emitter resistors establish the gain of the differential stage 12 and determine the range of differential input voltages over which the emitter-coupled pair behaves approximately as a linear amplifier.

Differential stage 12 responds to the application of differential input signals $-V_{in}/2$ and $V_{in}/2$ at the bases of transistors Q1 and Q2, respectively, by modulating currents $I_1 = I_E/2 - i_{in}/2$ and $I_2 = I_E/2 + i_{in}/2$ that flow through Q1 and Q2, respectively, where $I_E/2$ is the bias component and $\pm i_{in}/2$ are the differential components of the currents. Alternately, one of the bases can be connected to a reference voltage, typically ground, and a single-ended input $V_{in}$ can be applied to the other base. When $V_{in}$ equals zero, the current $I_E$ supplied by current source 20 is split equally between both sides of differential stage 12 so that $I_1 = I_2$ and $i_{in}$ is zero.

In general, the differential stage 12 responds to the differential input voltage Vin by increasing the current that flows through its relatively positive side and by reducing the current that flows through its relatively negative side by an equal amount so that $I_1$ and $I_2$ are imbalanced. Employing a first order analysis and assuming that the base currents of Q1 and Q2 can be ignored, the relationship between $I_2$ and $I_1$ can be described as follows:

$$I_2 - I_1 = i_{in} = V_{in}/Re + (V_{be}(Q_1) - V_{be}(Q2))/R_E \qquad (1)$$

The gain control stage 14 includes two pair of emitter-coupled transistors Q3, Q4 and Q5, Q6, respectively. The emitters 22 and 24 of Q3 and Q4, respectively, are connected to the collector 26 of Q1, and together supply current $I_1$. Similarly, the emitters 28 and 30 of Q5 and Q6, respectively, are connected to the collector 32 of Q2, and together supply current $I_2$. As shown, the bases 34 and 36 of transistors Q3 and Q6 are connected to a reference voltage, typically ground.

A variable gain control voltage $V_c$ is applied to the bases 38 and 40 of transistors Q4 and Q5, which are connected together, causing the currents $I_1$ and $I_2$ to be split into currents $I_3$ and $I_4$, and $I_5$ and $I_6$, respectively, where $I_4 = GI_1$, $I_3 = (1-G)I_1$, $I_5 = GI_2$ and $I_6 = (1-G)I_2$. The splitting fraction G varies between 0 and 1 in response to the gain control voltage $V_c$ according to the following relation:

$$G = \frac{e^{V_c/V_t}}{1 + e^{V_c/V_t}} \qquad (2)$$

where $V_t$ is the transistor's thermal voltage $$\frac{kT}{q}.$$

Alternately, the gain control voltage $V_c$ could be applied differentially between the bases of Q4 and Q5, and Q3 and Q6.

The collectors 42 and 44 of transistors Q3 and Q6, respectively, are connected directly to a high voltage supply $V_{cc}$, and the collectors 46 and 48 of Q4 and Q5, respectively, are connected through a pair of load resistors $R_L$ to $V_{cc}$. A differential output voltage $V_{out}$ is taken between output terminals A and B at the collectors 46 and 48 of Q4 and Q5, respectively, and can be characterized as follows:

$$V_{out} = V_B - V_A = -GR_g (I_2 - I_1) \tag{3}$$

Combining equations 1 and 3 gives:

$$V_{out} = \frac{-GR_g}{R_E} (V_{in} + (V_{be}(Q1) - V_{be}(Q2))) \tag{4}$$

The term $$\frac{-GR_g}{R_E} V_{in}$$

represents the desired linear response to the differential input voltage. The term $$\frac{-GR_g}{R_E} (V_{be}(Q1) - V_{be}(Q2))$$

is manifested as an odd-order non-linearity distortion in the differential output voltage, and is the result of the inherent distortion characteristics of transistors Q1 and Q2.

To reduce the odd-order non-linearity distortion, Sansen and Meyer reconfigure the gain control stage, as shown in their FIG. 4, so that the collectors of Q3 and Q5 are connected together to one of the load resistors $R_L$ and the collectors of Q4 and Q6 are connected together to the other load resistor. The output voltage $V_{out}$ is then taken between the collectors of Q5 and Q6, which reduces the odd-order distortion.

SUMMARY OF THE INVENTION

The present invention provides a wide-band voltage controlled amplifier having significantly improved linearity.

This is accomplished with a differential stage that includes a pair of differentially connected primary transistors, a primary resistance circuit connected between their emitters and having resistance $2R_E$, and a primary current source that supplies a bias current. The differential stage responds to an input signal applied between the transistors' bases to apportion the bias current between the primary transistors to produce a differential signal current between their collectors. The differential signal current has a linear component and a non-linear component that, to a first order approximation, is equal to the difference in the primary transistors' base-emitter voltages divided by the resistance of the primary resistance circuit.

A gain control stage includes two pair of emitter-coupled transistors that are connected to the primary transistors' respective collectors and conduct the linear component of the differential signal current. The gain control stage responds to a gain control signal applied between the bases of the emitter-coupled transistors to apportion a fraction G of the linear component to a differential output current to set the gain of the VCA. The transistor pairs have a common base connection such that a differential voltage signal between the primary transistors' collectors is approximately equal to the difference in their base-emitter voltages.

A negative resistance circuit that has an apparent resistance of approximately $-2R_E$ is connected between the primary transistors' collectors and produces a correction current that supplies the non-linear component of the differential signal current thereby reducing the non-linearity distortion of the differential output current. The negative resistance circuit includes a pair of cross-coupled transistors, with the base of each transistor being connected to the collector of the other transistor, and a pair of emitter resistors that are connected between the respective emitters and a current source. The cross-coupled transistors effectively reverse the polarity of the differential voltage so that the differential stage appears to have a negative resistance connected between the collectors of the emitter-coupled transistors.

In the preferred embodiment the negative resistance circuit also includes a pair of diodes, preferably diode-connected transistors, that are connected to conduct respectively from the collector of one emitter-coupled transistor to the collector of one of the cross-coupled transistors, and from the collector of the other emitter-coupled transistor to the collector of the other cross-coupled transistor.

For a better understanding of the invention, and to show how the same may be carried into effect, reference will now be made, by way of example, to the accompanying drawings.

DETAILED DESCRIPTION OF THE INVENTION

Figure 1:
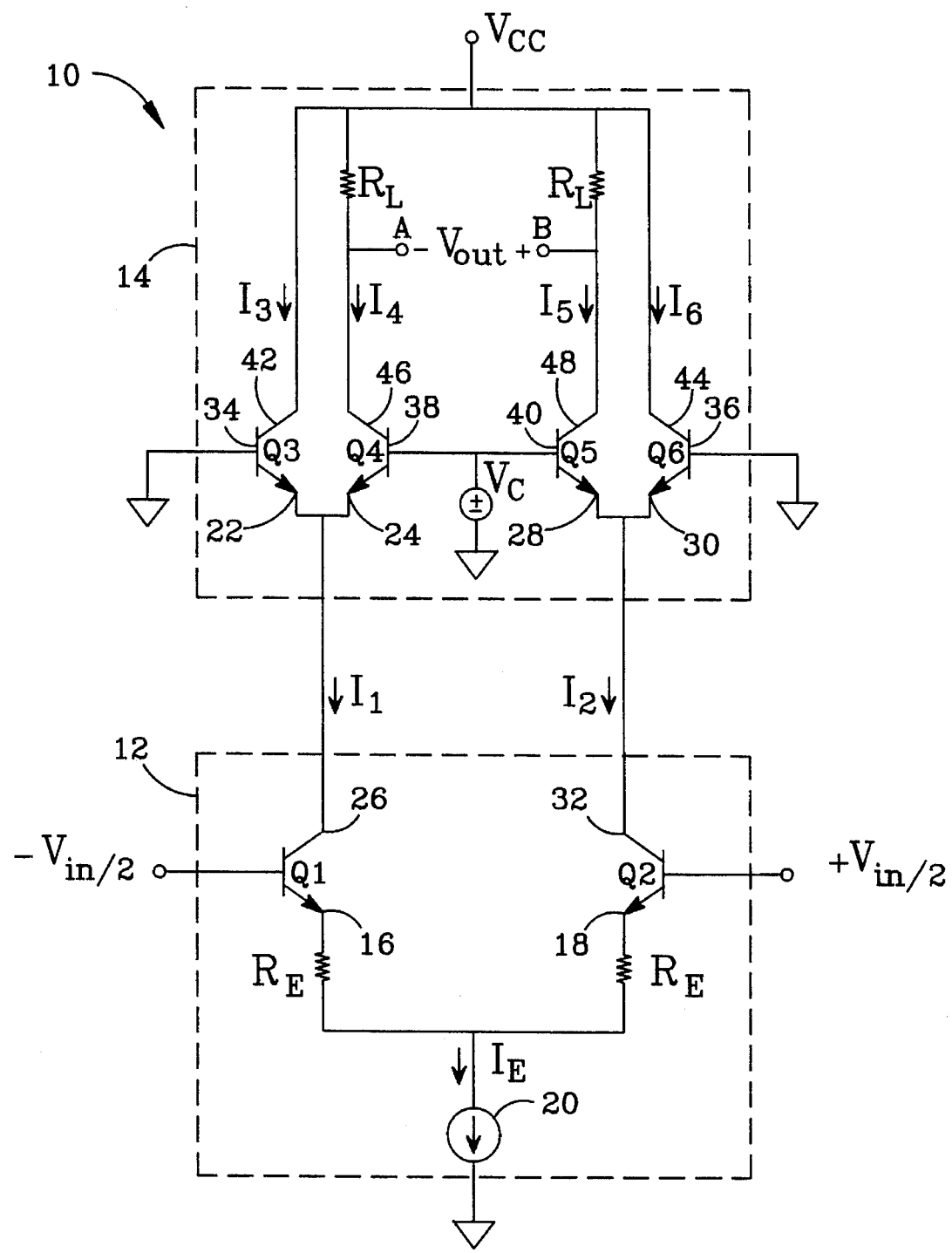
FIG. 1, as described above, is a schematic diagram of a prior VCA.
Figure 2:
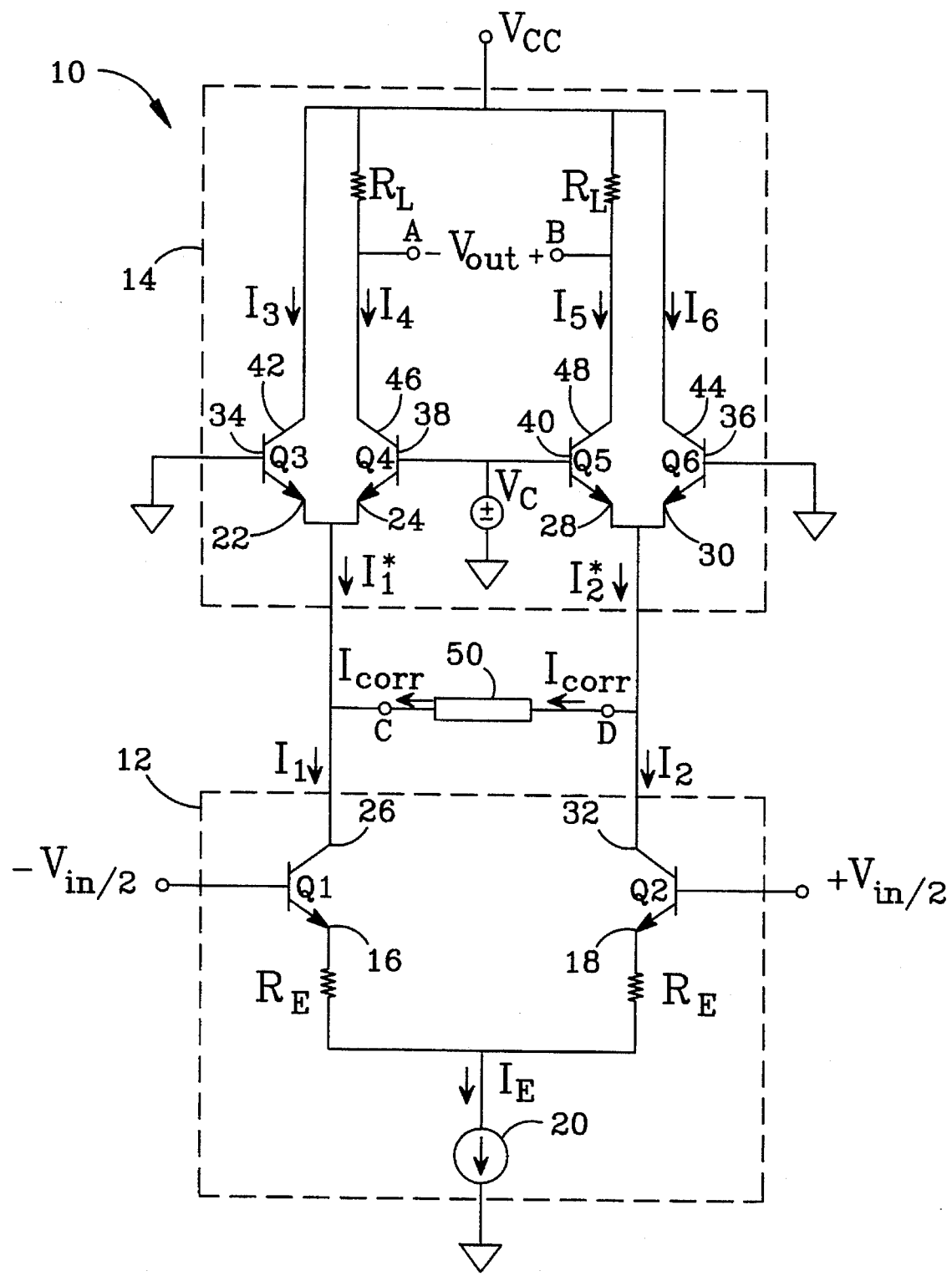
FIG. 2 is a schematic diagram of a VCA with a negative resistance circuit that improves the linearity of the VCA in accordance with the invention.

The present invention reduces non-linearity distortion in a VCA of the type shown in FIG. 1 by providing a negative resistance circuit 50 that is connected between terminals C and D at the collectors 26 of Q1 and 32 of Q2, respectively, as shown in FIG. 2. The negative resistance circuit 50 supplies a differential correction current $I_{corr}$ that ideally cancels the non-linear component of the differential current $i_{in}$ in both sides of the differential stage 12. As a result, transistors Q3 and Q4 together, and and Q6 together respectively supply currents $I_1^*$ and $I_2^*$ that vary approximately linearly with changes in the differential input voltage $V_{in}$. The currents $I_1^*$ and $I_2^*$ are given as follows:

$$I_1^* = I_1 - I_{corr} \tag{5}$$

$$I_2^* = I_2 + I_{corr} \tag{6}$$

Thus, the differential current supplied to the gain control stage 14 can be characterized by:

$$I_2^* - I_1^* = \frac{V_{in}}{R_E} + \frac{(V_{be}(Q1) - V_{be}(Q2))}{R_E} + 2I_{corr} \quad (7)$$

To cancel the distortion term in equation 7, the correction current $I_{corr}$ must satisfy:

$$I_{corr} = \frac{(V_{be}(Q1) - V_{be}(Q2))}{-2R_E} \quad (8)$$

The voltage across the negative resistance circuit 50 between terminals D and C is given by:

$$V_D - V_c = V_{be}(Q4) - V_{be}(Q5) \quad (9)$$

For purpose of bias computations, to a first order, $I_1^* = I_1$ and $I_2^* = I_2$. Thus, the base-emitter voltage of transistor Q4 is given by:

$$V_{be}(Q4) = V_t \log\left(\frac{GI_1}{I_s}\right) \quad (10)$$

$$V_{be}(Q4) = V_{be}(Q1) + V_t \log\left(\frac{G}{I_s}\right) \quad (11)$$

where $I_s$ is the transistor saturation current. Similarly, $$V_{be}(Q5) = V_{be}(Q2) + V_t \log\left(\frac{G}{I_s}\right) \quad (12)$$

Substituting equations 11 and 12 into equation 9 gives the following result:

$$V_D - V_c = V_{be}(Q1) - V_{be}(Q2) \quad (13)$$

Thus, $$I_{corr} = \frac{V_D - V_C}{-2R_E} \quad (14)$$

will cancel the distortion term in equation 7 so that $I_2^* - I_1^* = V_{in}/R_E$ as desired. This, in turn, to a first order approximation, cancels the non-linearity distortion in the VCA's output voltage $V_{out}$.

Negative resistance circuit 50 exhibits an apparent resistance of $-2R_E$ and generates the correction current given in equation 14 by cross-coupling the voltages $V_D$ and $V_C$ to produce a differential voltage with the same magnitude but opposite polarity. This voltage is applied across a series combination of two emitter resistors that have the same resistance as the emitter resistors $R_E$ in differential stage 12 so that $I_{corr}$ is added to $I_2$ and is subtracted from $I_1$.

Figure 3:
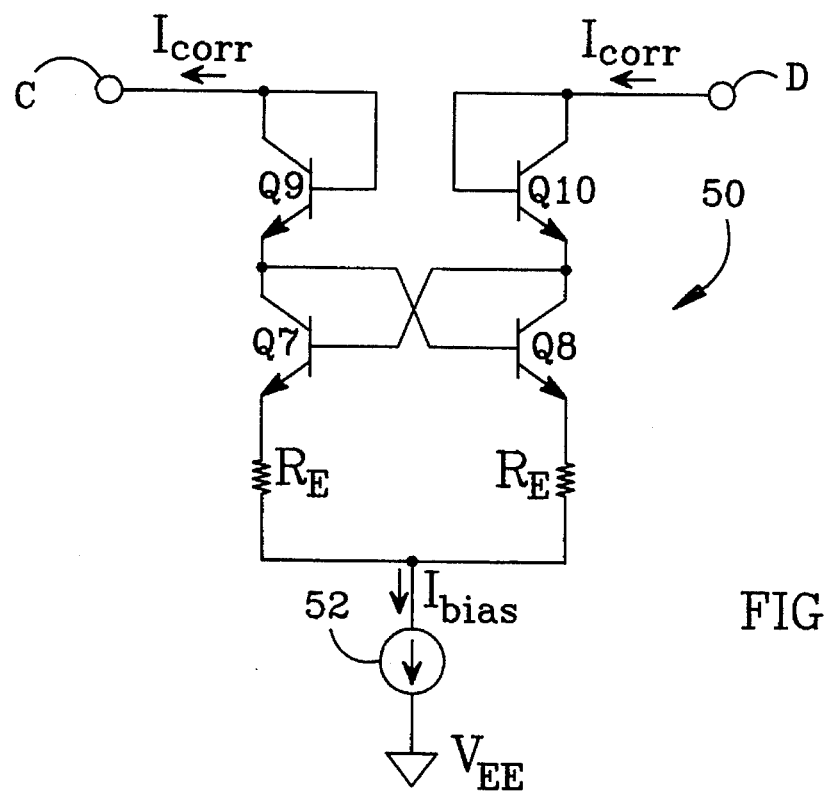
FIG. 3 is a schematic diagram of a preferred embodiment of the negative resistance circuit.

FIG. 3 shows a preferred implementation for the negative resistance circuit 50 which includes a pair of cross-coupled emitter-coupled transistors Q7 and Q8. The base of Q7 is connected to the collector of Q8 and the base of Q8 is connected to the collector of Q7. A pair of emitter resistors ($R_E$) are connected from the respective emitters to a bias current source 52 that supplies current $I_{bias}$ and is connected to $V_{EE}$. A pair of diode-connected transistors Q9 and Q10 are connected in series with transistors Q7 and Q8, respectively, with the emitter of Q9 connected to the collector of Q7, and the emitter of Q10 connected to the collector of Q8. The base/collector of Q9 is connected to terminal C and the base/collector of Q10 is connected to terminal D shown in FIG. 2.

Neglecting base currents, $$I_c(Q7) = I_c(Q9) \quad (15)$$

$$I_c(Q8) = I_c(Q10) \quad (16)$$

$$V_{be}(Q7) = V_{be}(Q9) \quad (17)$$

$$V_{be}(Q8) = V_{be}(Q10) \quad (18)$$

where $I_c$ refers to collector current flowing through a particular transistor and $V_{be}$ refers to the base-emitter voltage of a particular transistor.

The voltages at the emitters of transistors Q7 and Q8 are given by:

$$V_e(Q7) = V_D - V_{be}(Q10) - V_{be}(Q7) \quad (19)$$

and $$V_e(Q8) = V_c - V_{be}(Q9) - V_{be}(Q8) \quad (20)$$

The voltage across the series connected emitter resistors, which is found by subtracting equation 19 from equation 20 and substituting the relationships in equations 15–18, is given by:

$$V_e(Q8) - V_e(Q7) = V_c - V_D \quad (21)$$

Thus, the polarity of the differential output voltage has been effectively reversed so that viewed from terminals C and D the resistance of negative resistance circuit 50 appears to be $-2R_E$.

The total differential current in the negative resistance circuit 50 is characterized by:

$$I_c(Q10) - I_c(Q9) = 2I_{corr} = \frac{V_e(Q8) - V_e(Q7)}{R_E} \quad (22)$$

Substituting equation 21 and solving for $I_{corr}$ gives:

$$I_{corr} = \frac{V_D - V_C}{-2R_E} \quad (23)$$

as required by equation 14 to cancel, to a first order approximation, the non-linearity distortion term in equation 7.

The circuit shown in FIG. 3 is somewhat similar to the conventional Caprio Cell, which is used as a voltage-to-current converter. However, in a Caprio Cell the transistors Q9 and Q10 are not diode-connected; the base of Q9 is grounded and the base of Q10 receives an input voltage, with the current output taken as the difference between their collector currents. Caprio Cells have a very limited input voltage range, considerably less than the input range offered by the invention before one of the cross-coupled transistors becomes saturated.

Figure 4:
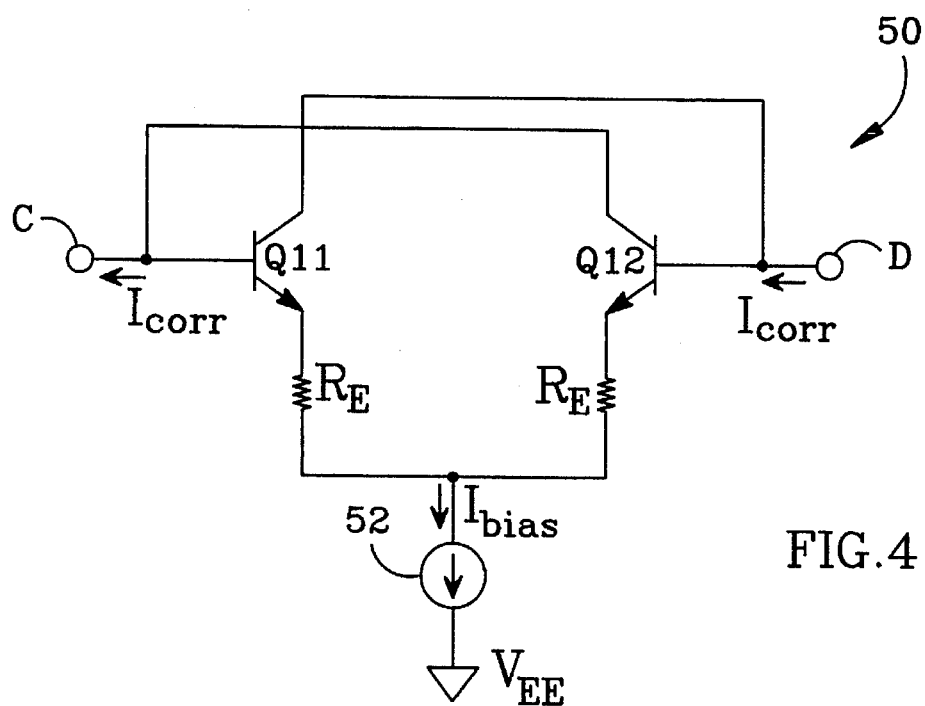
FIG. 4 is a schematic diagram of an alternate embodiment of the negative resistance circuit.

FIG. 4 shows a second embodiment of the negative resistance circuit 50 that is similar to the embodiment discussed above with respect to FIGS. 2–3. In this configuration, emitter-coupled transistors Q11 and Q12 are cross-coupled with the base of Q12 and the collector of Q11 connected to terminal D and the base of Q11 and the collector of Q12 connected to terminal C. This configuration also reduces the amount of distortion in the differential stage 12, compared to the circuit shown in FIG. 1, but is less accurate than the embodiment shown in FIG. 3 because of the non-linearities associated with Q11 and Q12.

Although the foregoing has been discussed with respect to a first order analysis, it is to be understood that this design is equally suitable in reducing distortion under a more exacting analysis. In addition, the foregoing circuit may be effective using pnp BJTs, instead of the npn BJTs as shown in the figures. Furthermore, the application of the negative resistance circuit described herein is not limited to the particular VCA topology shown.

While several illustrative embodiments of the invention have been shown and described, numerous variations and alternate embodiment will occur to those skilled in the art. Such variations and alternate embodiments are contemplated, and can be made without departing from the spirit and scope of the invention as defined in the appended claims.

I claim:

1. A voltage controlled amplifier (VCA), comprising:

an input differential stage including a pair of differentially connected primary transistors that respond to an input signal by producing a differential signal current at a pair of control terminals, said transistors having different pn junction voltages that induce non-linearity distortion in the differential signal current which produces a differential error voltage between the control terminals;

a gain control stage that has a gain control input, said gain control stage producing a differential output current and a differential control current that sum together to provide said differential signal current and responding to a gain control signal applied to said gain control input to apportion a fraction G of the differential signal current to the differential output current to set the gain of the VCA; and a negative resistance circuit connected between said control terminals to compensate for the differential error voltage and thereby alter said differential output current to reduce its non-linearity distortion.

2. The differential amplifier of claim 1, wherein said negative resistance circuit comprises:

a pair of cross-coupled transistors having respective bases, collectors and emitters, said respective bases being connected to the collectors of the opposing cross-coupled transistors which are coupled to the respective control terminals such that a correction voltage signal between their emitters has a polarity opposite that of said differential error voltage;

a first resistance circuit connected between the emitters of said cross-coupled transistors; and a first current source that supplies a bias current that flows through said cross-coupled transistors and said resistance circuit, said cross-coupled pair of transistors responding to changes in said differential error voltage by dividing the bias current between said cross-coupled transistors to produce a differential correction current that alters the differential output current to reduce its non-linearity distortion.

3. The differential amplifier of claim 2, wherein said negative resistance circuit further comprises a pair of diodes that are connected in series between said respective control terminals and the collectors of said respective cross-coupled transistors such that the voltages from the control terminals to the emitters of the respective cross-coupled transistors are approximately the same so that the correction voltage signal has approximately the same magnitude as the differential error voltage with opposite polarity.

4. The differential amplifier of claim 3, wherein said first and second diodes are diode-connected transistors.

5. The differential amplifier of claim 3, wherein said pair of differentially connected primary transistors have respective bases, collectors that are connected to respective control terminals, and emitters, said differential stage further comprising:

a second resistance circuit connected between the respective emitters; and a second current source that supplies a second bias current to said primary transistors and said second resistance circuit, said differential stage responding to said input signal applied between the primary transistors' bases to apportion said second bias current between said primary transistors to produce said differential signal current.

6. The VCA of claim 5, wherein said primary transistors produce a non-linearity in said differential signal current that, to a first order approximation, is equal to the difference in their base-emitter voltages divided by the resistance of said second resistance circuit, said gain control stage including a pair of base-connected gain transistors having emitters that are connected to said primary transistors' respective collectors such that the differential error voltage between said control terminals is approximately the same as the difference between their base-emitter voltages, said first resistance circuit having approximately the same resistance as said second resistance circuit so that said correction current substantially cancels the non-linearity in said differential signal current.

7. A voltage controlled amplifier (VCA), comprising:

an input differential stage that includes a pair of differentially connected primary transistors having respective bases, collectors, and emitters, a primary resistance circuit connected between said emitters and having resistance $2R_E$, and a primary current source that supplies a bias current, said input differential stage responding to an input signal applied between said bases to apportion said bias current between said primary transistors to produce a differential signal current between their collectors, said differential signal current having a linear component and a non-linear component that, to a first order approximation, is equal to the difference in the primary transistors' base-emitter voltages divided by the resistance of said primary resistance circuit;

a gain control stage that includes two pair of emitter-coupled transistors that are connected to the primary transistors' respective collectors and conduct the linear component of said differential signal current, said gain control stage responding to a gain control signal applied between the bases of said emitter-coupled transistors to apportion a fraction G of the linear component to a differential output current to set the gain of the VCA, said transistor pairs having a common base connection such that a differential error voltage between the primary transistors' collectors is approximately equal to the difference in their base-emitter voltages; and a negative resistance circuit connected between the primary transistors' collectors, said negative resistance circuit having an apparent resistance of approximately $-2R_E$ so that it produces a correction current that supplies the non-linear component of the differential signal current thereby reducing the non-linearity distortion of said differential output current.

8. The differential amplifier of claim 7, wherein said negative resistance circuit comprises:

a pair of diodes that are connected to the primary transistors respective collectors;

a pair of cross-coupled transistors having respective bases, collectors and emitters, said respective bases being connected to the collectors of the opposing cross-coupled transistor and to the respective diodes such that a correction voltage signal between their emitters has approximately the same magnitude as said differential voltage signal with opposite polarity;

a second resistance circuit that is connected between the emitters of said cross-coupled transistors; and a second current source that supplies a second bias current to said cross-coupled transistors and said second resistance circuit, said cross-coupled pair of transistors responding to changes in said differential voltage signal by dividing the bias current between said cross-coupled transistors to modulate said correction current to supply the non-linear component of the differential signal current.

* * * * *